US006909528B2

(12) United States Patent
Korzinin et al.

(10) Patent No.: US 6,909,528 B2
(45) Date of Patent: Jun. 21, 2005

(54) PHASE VOLUME HOLOGRAM AND METHOD FOR PRODUCING THE PHASE VOLUME HOLOGRAM

(75) Inventors: Yuri L Korzinin, St. Petersburg (RU); Alia M Kursakova, St. Petersburg (RU); Nikita S Shelekhov, St. Petersburg (RU); Vitaly I Sukhanov, St. Petersburg (RU)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 10/464,147

(22) Filed: Jun. 17, 2003

(65) Prior Publication Data

US 2004/0036932 A1 Feb. 26, 2004

(51) Int. Cl.[7] .................................................. G03H 1/02
(52) U.S. Cl. ............................. 359/3; 430/1; 430/290; 430/321; 359/7
(58) Field of Search ............................. 359/3, 7; 430/1, 430/2, 290, 321

(56) References Cited

U.S. PATENT DOCUMENTS 4,816,376 A * 3/1989 Toshida ...................... 430/290
4,842,968 A   6/1989 Kojima et al. ................. 430/1

FOREIGN PATENT DOCUMENTS

| WO | WO99/09439  | 2/1999   |
|----|-------------|----------|
| WO | WO99/15939  | 4/1999   |
| WO | WO 99/15939 | * 4/1999 |

OTHER PUBLICATIONS

M.Schnoes, et al., "Photopolymer–filled nanoporous glass as a dimensionally stable holographic recording medium", Optics Letters 24(10), pp. 658–660(19990.*

Schnoes et al.; "Photopolymer–Filled Nanoporous Glass as a Dimensionally Stable Holographic Recording Medium"; Optics Letters; vol. 24, No. 10; May 15, 1999; pp. 658–660.

Gambogi et al.; "Advances and Applications of DuPont Holographic Photopolymers"; Society of Photo–Optical Instrumentation Engineers; 1993; pages.

Sukhanov; "Porous Glass as a Storage Medium"; Optica Applicata; vol. 24, 1994; pages.

Sheat et al; "Volume Transmission Gratings in Dichromated Gelatin for Near Infra Red Applications"; Third International Conference on Holographic Systems, Components and Applications; 1991; pages.

Shelechov; "Optical Composites Based on Porous Silica Glasses"; Optica Applicata; vol. 24, No. 1–2; 1994; pages.

Chandross et al.; "Latent–imaging Photopolymer System"; Applied Optics; vol. 17, No. 4; Feb. 15, 1978; pp. 566–573.

* cited by examiner

Primary Examiner—Leonidas Boutsikaris
(74) Attorney, Agent, or Firm—Gregory V. Bean

(57) ABSTRACT

A phase volume hologram and a method for producing the phase volume hologram are described herein. The phase volume hologram is made by filling the microcavities of a porous transparent siliceous body with a polymerisable composition (e.g., liquid monomer or monomer/oligomer mixture). The filled siliceous body then has a hologram interference pattern recorded therein using a laser light that in conformity with the hologram interference pattern converts the polymerisable composition into a polymerized material (solid-phase polymer) and a non-polymerized material. In particular, the polymerized material has a volume fraction in the microcavities that is close to 1 in the vicinity of a maxima of the recorded interference pattern and close to 0 in the vicinity of a minima of the recorded interference pattern. Thereafter, the non-polymerized material is removed from the siliceous body which now resembles the phase volume hologram.

27 Claims, 2 Drawing Sheets

PHASE VOLUME HOLOGRAM AND METHOD FOR PRODUCING THE PHASE VOLUME HOLOGRAM

This application claims the benefit of priority under 35 U.S.C. § 119 of Russian Patent Application Serial No. 2002116488 filed on Jun. 18, 2002.

BACKGROUND OF THE INVENTION

1. Field of the Invention

The present invention relates in general to holography and, in particular, to a phase volume hologram and method for producing the phase volume hologram.

2. Description of Related Art

Phase volume holograms made from a polymer body that exhibits local variations of refractive index in conformity with the intensity of a recorded interference pattern are well known in the literature. These holograms are generally recorded in different layers of photopolymers and have an achievable level of refractive index modulation ($\Delta n$) near $3 \times 10^{-2}$. However, these holograms are usually made from organic materials that have low mechanical properties and low thermostability and, as such, are not very reliable or durable. For more information about these types of holograms reference is made to an article by William J. Gambogi et al. entitled "*Advances and Applications of DuPont Holographic Photopolymers*" Optics Quebec '93, Conf. 2043, August 1993. This article is hereby incorporated by reference herein.

Also well known in the literature are phase volume holograms made from a porous siliceous body completely filled with a solid-phase polymeric material that exhibits local variations of refractive index in conformity with the intensity of a recorded interference pattern. These holograms have better mechanical properties and optical properties than the aforementioned holograms recorded in a polymer body. However, these holograms have an achievable level of refractive index modulation ($\Delta n$) that is not very high, $\sim 3.5 \times 10^{-3}$. For more information about these types of holograms reference is made to the following documents which are incorporated by reference herein:

Melinda G. Schnoes et al. "*Photopolymer-Filled Nanoporous Glass as a Dimensionally Stable Holographic Recording Medium*" Optics Letters, Vol. 24, No. 10, pp. 658–660, May 15, 1999.

N. S. Shelechov "*Optical Composites Based on Porous Silica glasses*" Optica Applicata, Vol. XXIV, No.1–2, pp. 27–35, 1994.

PCT Patent No. WO 99/15939 entitled "Volume Phase Hologram and Method for Producing the Same".

Accordingly, there is and has been a need for a phase volume hologram that addresses the aforementioned shortcomings and other shortcomings of the traditional phase volume holograms. These needs and other needs are satisfied by the phase volume hologram and method of the present invention.

BRIEF DESCRIPTION OF THE INVENTION

The present invention includes a phase volume hologram and a method for producing the phase volume hologram. The phase volume hologram is made by filling the microcavities of a porous transparent siliceous body with a polymerisable composition (e.g., monomers or monomer/oligomer mixtures). The filled siliceous body then has a hologram pattern recorded therein using a light that converts portions of the polymerisable composition into a polymerized material in conformity with the hologram pattern, while leaving other portions of the polymerisable material in unpolymerized form. In particular, the polymerized material has a volume fraction in the microcavities that is close to 1 in the vicinity of maxima of a recorded interference pattern and close to 0 in the vicinity of minima of the recorded interference pattern. The non-polymerized material is then removed from the siliceous body thereby forming a phase volume hologram.

BRIEF DESCRIPTION OF THE DRAWINGS

A more complete understanding of the present invention may be had by reference to the following detailed description when taken in conjunction with the accompanying drawings wherein.

DETAILED DESCRIPTION OF THE DRAWINGS

Figure 1:
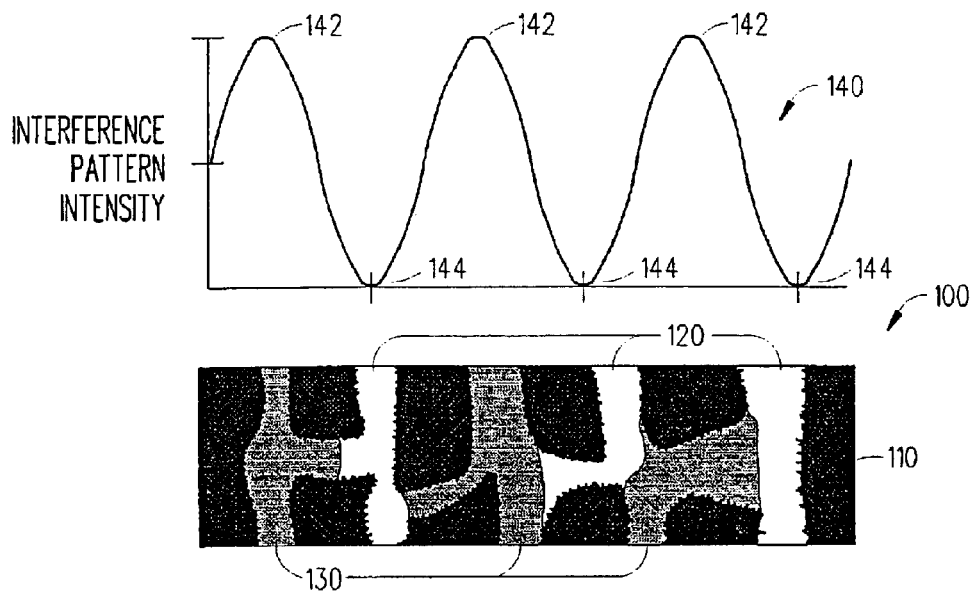
FIG. 1 is a cross-sectional side view of a phase volume hologram in accordance with the present invention.
Figure 2:
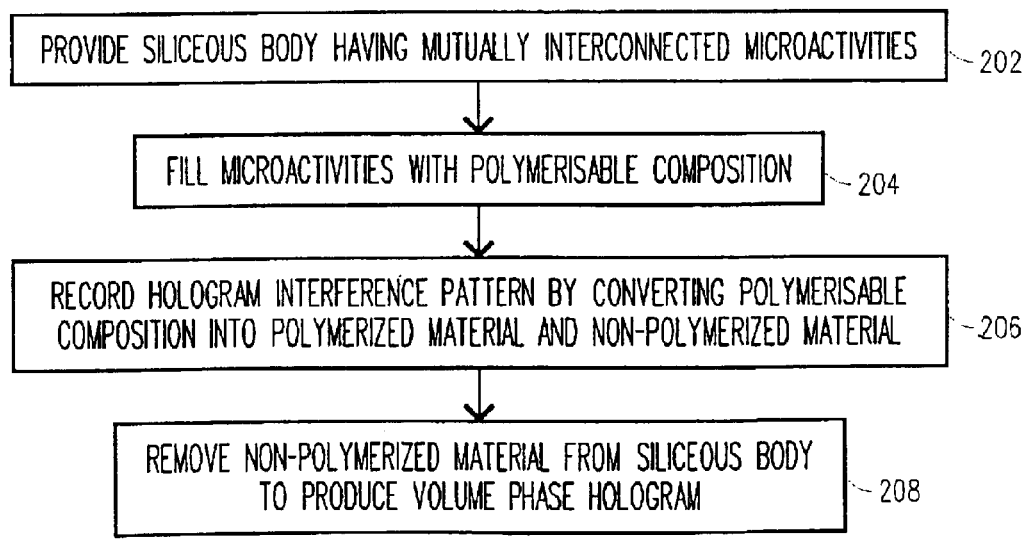
FIG. 2 is a flowchart illustrating the steps of a preferred method for fabricating the phase volume hologram.

Referring to FIGS. 1–3, there are disclosed a preferred phase volume hologram 100 and a preferred method 200 for producing the phase volume hologram 100 in accordance with the present invention.

Referring to FIG. 1, there is a cross-sectional side view of a phase volume hologram 100 in accordance with the present invention. Basically, the phase volume hologram 100 is made from a porous siliceous body 110 that has a system of microcavities 120 some of which are filled with a solid-phase polymeric material 130 spatially distributed into a porous siliceous body 110 which together exhibits local variations of refractive indexes in conformity with the intensity of a recorded interference pattern 140. The recorded interference pattern 140 made by a laser light (e.g., hologram recording light) represents the wavefront of light from an object as a refractive index modulation ($\Delta n$) in the phase volume hologram 100. The phase volume hologram 100 is able to reproduce or playback the wavefront of the object wave by diffracting a reference beam (e.g., light source, hologram reading light).

How the polymeric material 130 is spatially distributed within the siliceous body 110 can be seen best when comparing the recorded interference pattern 140 to the phase volume hologram 100. As shown, the polymeric material 130 has a volume fraction in the microcavities 120 of the siliceous body 110 that is close to 1 in the vicinity of a maxima 142 of the recorded interference pattern 140 and close to 0 in the vicinity of a minima 144 of the recorded interference pattern 140. The presence of a polymeric material 130 in the vicinity of the maxima 142 of the recorded interference pattern 140 and the absence of the polymeric material in the vicinity of the minima 144 of the recorded interference pattern 140 enables one to achieve a relatively high level of refractive index modulation ($\Delta n$). As described below with respect to Examples 1–4, the phase volume hologram 100 can attain a much higher level of refractive index modulation ($\Delta n$) than that of the traditional phase volume hologram made from a porous siliceous body which is completely filled with a polymeric material. And, the higher the level of the refractive index modulation ($\Delta n$), the better a wavefront of the object of the recorded interference pattern 140 can be reproduced by the phase volume hologram 100.

Some practical applications of the hologram 100 include (for example):

1. Polarization independent gratings wherein, for the given hologram thickness required, Δn is 3 times higher than for the usual polarization independent grating. (D. E. Sheat, A. J. M. Miles "Volume Transmission Gratings in Dichromated Gelatin for Near Infra Red Applications", Third International Conference on Holographic Systems, Components & Applications, 1991, pp. 83–87).
2. Holograms with overlayed multiple esposures for optical memory and multifunctional optical elements, wherein the number of holograms recorded in the same area or volume of material is proportional to the value of Δn (Melinda G. Schnoes et al. "Photopolymer-Filled Nanoporous Glass as a Dimensionally Stable Holographic Recording Medium" Optics Letters, Vol.24, No. 10, pp. 658–660, May 15, 1999).
3. Creation of photonic crystal structure by holographic methods, in which the greater the value of Δn, the better the performance parameters of the structure (PCT Patent No. WO 99/09439).

Referring to FIGS. 2 and 3A–3D, there are respectively illustrated a flowchart of the preferred method 200 for making the phase volume hologram 100 and various cross-sectional side views of the phase volume hologram 100 at different steps in the preferred method 200. Beginning at step 202, a porous transparent siliceous body 110 is provided that has a plurality of mutually interconnected pores or microcavities 120 (see FIG. 3A). The microcavities 120 have a mean radius which is lower than the wavelength of a hologram recording light or the wavelength of a hologram reading light. In the preferred embodiment, the siliceous body 110 can be a porous glass that is produced by leaching a borosilicate glass. For more information about the porous glass that can be used in the present invention reference is made to an aricle by V. I. Sukhanov entitled "*Porous Glass as a Storage Medium*" Optica Applicata, Vol. XXIV, No.1–2, pp. 13–26, 1994. This article is hereby incorporated by reference herein.

Figure 3A:
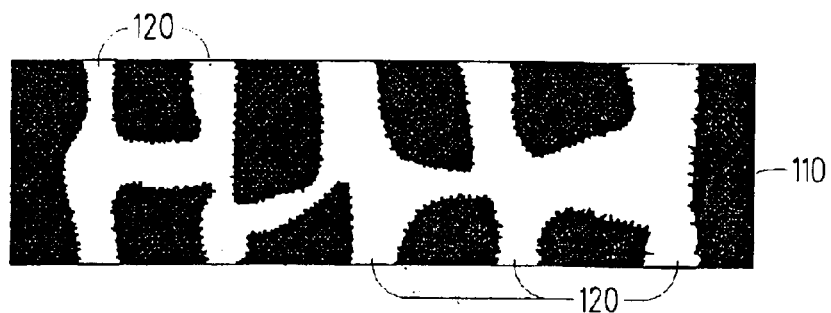
FIGS. 3A–3D illustrates cross-sectional side views of the phase volume hologram at different steps in the method shown in FIG. 2.
Figure 3B:
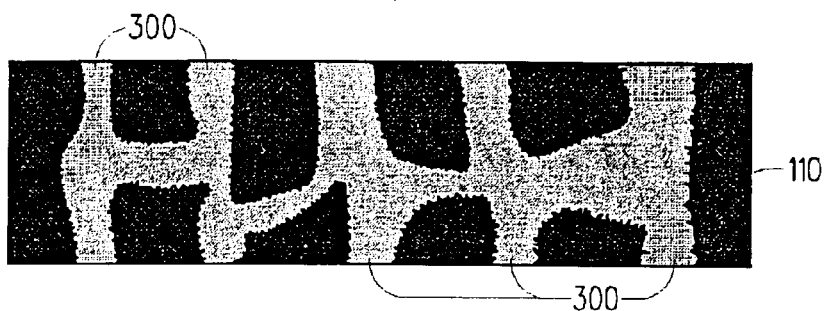

At step 204, the microcavities 120 of the siliceous body 110 are filled with a polymerisable composition 300 (e.g., photopolymerisable monomer/oligomer mixture) (see FIG. 3B). In the preferred embodiment, the free volume of the microcavities 120 in the siliceous body 110 can be filled with a polymerisable composition 300 by dipping the siliceous body 110 in a monomer/oligomer soultion with a photoinitiator (e.g., Irgacure 784). If needed, a vacuum can be applied to assist the impregnation of the polymerisable composition 300 into the siliceous body 110. Examples of a polymerisable composition 300 include:

A polymerisable composition having at least one acrylic monomer/oligomer.

A polymerisable composition having at least one acrylic monomer/oligomer with at least another copolymerizable material selected from a group of methacrylic monomers/oligomers.

A polymerisable composition having at least one methacrylic monomer/oligomer with at least another copolymerizable material selected from a group of vinyl monomers/oligomers.

A polymerisable composition having at least one acrylic monomer/oligomer with at least another copolymerizable material selected from a group of vinyl monomers/oligomers.

A polymerisable composition having at least one methacrylic monomer/oligomer.

A polymerisable composition having at least one vinyl structure monomer/oligomer.

In particular, the polymerisable composition 300 can be based on Bisphenol A alkoxylate dimethacrylate or diacrylate such as Bisphenol A ethoxylate (2 EO/phenol) dimethacrylate marketed under the trademark D121, and mixtures thereof with or without copolymerizable monomers such as:

vinyl acetate;

styrene;

oligourethanes/oligocarbonates having terminal methacrylate or acrylate functionality;

(meth)acrylates/multifunctional(meth)acrylates, for example, methyl methacrylate (MMA)/ethylene glycol dimethacrylate (DMGE), trimethylolpropane ethoxylate (7/3EO/OH) triacrylate (TMPA);

vinyl-containing monomers, for example, vinyl acetate (VA) or vinyl chloride (VC); or mixtures of styrene with copolymerizable monomers such as MMA VA, DMGE, TMPA or oligourethanes/oligocarbonates.

It should be understood that a variety of polymerisable compositions 300 now known or subsequently developed can be used to fill the siliceous body 110 and make the phase volume hologram 100.

Figure 3C:
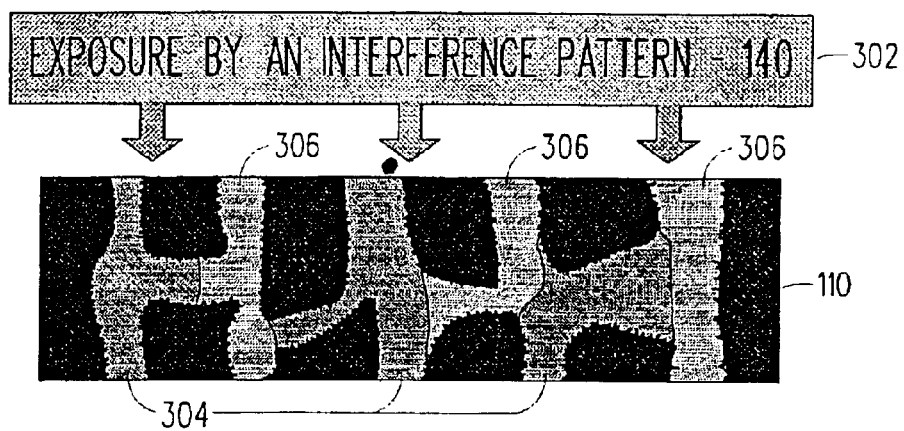

At step 206, a laser light 302 is used to record a hologram interference pattern 140 within the filled siliceous body 110 (see FIGS. 1 and 3C). The laser light 302 has an intensity that conforms with the hologram interference pattern 140 and converts the polymerisable composition 300 within the siliceous body 110 into a polymerized material 304 (e.g., polymeric material 130) and a non-polymerized material 306. In particular, the polymerized material 304 has a volume fraction within the microcavities 120 that is close to 1 in the vicinity of the maxima 142 of the recorded interference pattern 140 and close to 0 in the vicinity of the minima 144 of the recorded interference pattern 140. In contrast, the non-polymerized material 306 has a volume fraction within the microcavities 120 that is close to 0 in the vicinity of the maxima 142 of the recorded interference pattern 140 and close to 1 in the vicinity of the minima 144 of the recorded interference pattern 140.

Figure 3D:
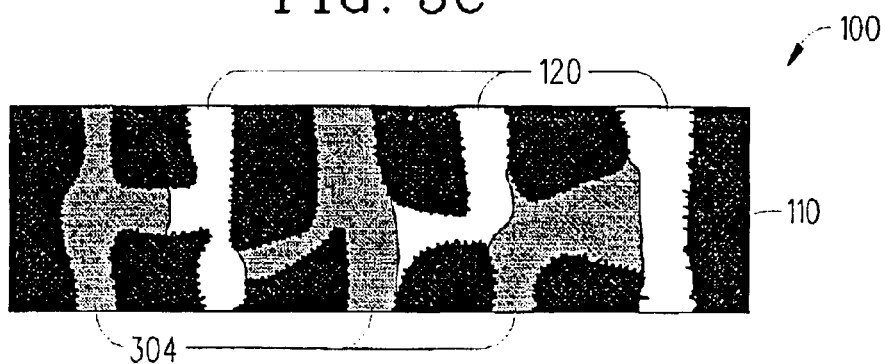

At step 208, the non-polymerized material 306 is removed from the siliceous body 110 to produce the phase volume hologram 100 (see FIG. 3D). The non-polymerized material 306 typically contains low molecular weight monomers or oligomers. In contrast, the polymerized material 304 typically contains high molecular weight cross-linked polymers. Since the non-polymerized material 306 are low molecular weight monomers or oligomers which are soluble in organic solvents, they can be easily removed from the siliceous body 110 while the polymerized material 304 remains spatially distributed within the siliceous body 110. For instance, the non-polymerized material 306 can be removed by treating the siliceous body 110 with an organic solvent (e.g., acetone). Alternatively, the non-polymerized material 306 can be removed by treating the siliceous body 110 with an organic solvent in an ultra-sonic field. In yet another way, the non-polymerized material 306 that are characterized with alternatively high volatility can be removed from the siliceous body 110 through evaporation. If desired, the voids in the phase volume hologram 100 created by the removal of the non-polymerized material 306 can be filled with a transparent solid phase or liquid substance possessing electro-optical, photo-refractive or non-linear properties to operate the hologram parameters (not shown).

At this point, the phase volume hologram 100 is made from the porous siliceous body 10 which has mutually interconnected microcavities 120 that have a mean radius which is lower than a wavelength of a hologram recording light and a wavelength of a hologram reading light. The siliceous body 110 has polymerized material 304 located in certain microcavities 120 such that the polymerized material 304 and siliceous body 110 exhibits local variations of spatial mass distribution where the local variations are spatially modulated in conformity with the intensity of the recorded interference pattern 140. It is the presence of the polymerized material 304 in the vicinity of the maxima 142 of the recorded interference pattern 140 and the absence of the polymerized material 304 (and the non-polymerized material 306) in the vicinity of the minima 144 of the recorded interference pattern 140 which enables one to achieve a relatively high level of refractive index modulation ($\Delta n$). Again, the higher the level of the refractive index modulation ($\Delta n$), the better a wavefront of the object of the recorded interference pattern 140 can be reproduced by the phase volume hologram 100.

Some practical applications of the hologram 100 include (for example):

1. Polarization independent gratings wherein, for the given hologram thickness required, $\Delta n$ is in 3 times higher than for the usual polarization independent grating. (D. E. Sheat, A. J'. M. Miles "Volume Transmission Gratings in Dichromated Gelatin for Near Infra Red Applications", Third International Conference on Holographic Systems, Components & Applications, 1991, pp. 83–87).

2. Holograms with overlayed multiple exposures for optical memory and multifunctional optical elements, wherein the number of holograms recorded in the same area of material is proportional to the value of $\Delta n$ (Melinda G. Schnoes et al. "Photopolymer-Filled Nanoporous Glass as a Dimensionally Stable Holographic Recording Medium" Optics Letters, Vol.24, No. 10, pp. 658–660, May 15, 1999).

3. Creation of photonic crystal structure by holographic methods, in which the greater the value of $\Delta n$, the better the performance parameters of the structure (PCT Patent No. WO 99/09439).

In particular, the refractive index modulation ($\Delta n$) of the phase volume hologram 100 is defined by the spatial mass distribution of the polymerized material 304. The refractive index modulation ($\Delta n$) can be defined as:

$$\Delta n = F \times (f_B - f_A) \times (n_{air} - n_f) \quad (1)$$

wherein
i. F=relative volume of microcavities 120,
ii. $f_B$=relative volume of non-polymerized material 306 in microcavities 120 of siliceous body 110—which is generally zero in the present invention,
iii. $f_A$=relative volume of polymerized material 304 in microcavities 120 of siliceous body 110,
iv. $n_f$=refractive index of the polymerized material 304, and
v. $n_{air}$=refractive index of air in the empty microcavities 120.

(If the empty microcavities 120 are later filled with a transparent polymer, then $n_{air}$ becomes $n_{filler\ material}$.)

For example, if a phase volume hologram 100 has F=0.4, $f_A$=1, $f_B$=0, $n_{air}$=1, $n_f$=1.5 then $\Delta n$=0.2. The $\Delta n$ of 0.2 is more than 5 times higher than the $\Delta n$=0.03 of the traditional phase volume hologram made from a polymer body. And, the $\Delta n$ of 0.2 is more than 20 times higher than the $\Delta n$=0.0035 of the traditional phase volume hologram made from a siliceous body that is completely filled with a solid-phase polymeric material. Thus, it is possible to make a phase volume hologram 100 with a relatively high value of refractive index modulation ($\Delta n$) because of the local variations of the spatially distributed polymerized material 304. The ability to increase the refractive index modulation ($\Delta n$) is based on the difference between $n_{air}$ and $n_f$, and the difference between the relative volumes of polymer filler in microcavities 120 into exposed and non-exposed regions where the best case scenario is $f_A$=1 and $f_B$=0.

Following are illustrative examples of phase volume holograms 100 that were made in accordance with the present invention:

EXAMPLE 1

1. A porous siliceous glass body 110 with a mean pore radius of ~6–10 nm and volume fraction of pores ~25–30 $cm^3/cm^3$ was used in the form of plates 20×20 mm. The thickness of the porous surface layers is 100 $\mu$m. The porous layers were obtained by leaching a 1.5 mm thick borosilicate glass for 60 minutes in boiling water.

2. The filling of porous layers in the borosilicate glass 110 with a solid-phase polymer 130 was done in the following manner. The dried borosilicate glass 110 was impregnated with 1.5% by weight solution of an initiator (Irgacure 784) in Bisphenol A ethoxylate (2 EO/phenol) dimethacrylate (D 121) at room temperature for 72 hours.

3. A transmission hologram 140 was recorded with the use of argon laser light 302 (488 nm) at an angle between the recording beams of 37°. The argon laser light 302 had an exposure energy of 30 $mJ/cm^2$ and a spatial frequency of 2500 $mm^{-1}$ of an interference pattern.

4. The non-polymerized material 306 was removed by treating the borosilicate glass 110 with the recorded hologram in boiling acetone for 30 minutes.

5. The refractive index modulation ($\Delta n$) or diffraction efficiency of the hologram recorded in the borosilicate glass 110 was measured. All experimental data is presented in TABLE 1.

EXAMPLE 2

The steps 1–5 of Example 1 were repeated except that the argon laser light 302 had an exposure energy of 80 $mJ/cm^2$ and a spatial frequency of 2500 $mm^{-1}$. All experimental data is presented in TABLE 1.

EXAMPLE 3

The steps 1–5 of Example 1 were repeated except that the non-polymerized material 306 was removed by treating the borosilicate glass 110 with the recorded hologram in boiling acetone in an ultra-sonic field of 40 kHz. All experimental data is presented in TABLE 1.

EXAMPLE 4

The steps 1–5 of Example 1 were repeated except that the filing of porous layers in the borosilicate glass 110 with a monomer/oligomer mixture 300 having the following composition: the solution of Irgacure 784 (0.5% Wt.) and of sensibilizator/activator system (Auramine/Michler's ketone, 0.25% Wt./1% Wt.) in polyester oligomer/styrene mixture (0.58 and 0.42% by volume). Also, the argon laser light 302 had an exposure energy of 500 mJ/cm². All experimental data is presented in TABLE 1.

TABLE 1

| Example | Porous Layer Thickness (μm) | Photopolymerisable Composition | | Refractive Index Modulation (Δn) |
|---|---|---|---|---|
| | | Irgacure 784 (% Wt.) | Monomer/Oligomer | |
| Example 1 | 100 | 1.5 | D 121 | 0.03 |
| Example 2 | 50 | 0.8 | TMPA | 0.03 |
| Example 3 | 100 | — | PC-488* | 0.05 |
| Example 4 | 100 | 0.5 + Aur./M's ketone | Styrene/PE | 0.07 |

PC-488* - Photopolymerisable composition on the base of oligocarbonate methacrylate.

From the foregoing, it can be readily appreciated by those skilled in the art that the phase volume hologram 100 of the present invention can be used in a variety of applications in which an optical device containing a light source (e.g., hologram reading light) is used to illuminate the phase volume hologram 100. These applications include, for example, automotive displays and lighting systems, laser filters, optical data storage, computation, graphic arts and security devices.

Although one embodiment of the present invention has been illustrated in the accompanying Drawings and described in the foregoing Detailed Description, it should be understood that the invention is not limited to the embodiment disclosed, but is capable of numerous rearrangements, modifications and substitutions without departing from the spirit of the invention as set forth and defined by the following claims.

What is claimed is:

1. A phase volume hologram, comprising:
a porous transparent siliceous body including a plurality of microcavities, at least a plurality of said microcavities containing a solid-phase polymeric material, said polymeric material filling a volume fraction within said microcavities, said volume fraction varying spatially within said siliceous body, such that said siliceous body exhibits local variations of refractive index.

2. The phase volume hologram of claim 1 wherein said polymeric material together with said siliceous body exhibits local variations of refractive index. in conformity with an intensity of a recorded interference pattern.

3. The phase volume hologram of claim 2, wherein said polymeric material within said microcavities has a volume fraction that is close to 1 in the vicinity of a maximum of the recorded interference pattern and close to 0 in the vicinity of a minimum of the recorded interference pattern.

4. The phase volume hologram of claim 2, wherein said microcavities have a mean radius which is less than a wavelength of a hologram recording light or a hologram reading light.

5. The phase volume hologram of claim 1, wherein said microcavities have a mean radius which is less than a wavelength of a hologram reading light.

6. The phase volume hologram of claim 1, wherein said siliceous body is a siliceous glass.

7. The phase volume hologram of claim 1, wherein said polymeric material is a polymer or copolymer having at least one acrylic monomer/oligomer.

8. The phase volume hologram of claim 1, wherein said polymeric material is a polymer or copolymer having at least one acrylic monomer/oligomer with at least another copolymerizable material selected from a group of methacrylic monomers/oligomers.

9. The phase volume hologram of claim 1, wherein said polymeric material is a polymer or copolymer having at least one acrylic monomer/oligomer with at least another copolymerizable material selected from a group of vinyl monomers/oligomers.

10. The phase volume hologram of claim 1, wherein said polymeric material is a polymer or copolymer having at least one methacrylic monomer/oligomer.

11. The phase volume hologram of claim 1, wherein said polymeric material is a polymer or copolymer having at least one methacrylic monomer/oligomer with at least another copolymerizable material selected from a group of vinyl monomers/oligomers.

12. The phase volume hologram of claim 1, wherein said polymeric material is a polymer or copolymer having at least one vinyl structure monomer/oligomer.

13. The phase volume hologram of claim 1, wherein a volume fraction of said microcavities not occupied by said polymeric material is occupied by air.

14. The phase volume hologram of claim 1, wherein a volume fraction of said microcavities not occupied by said polymeric material is occupied by a transparent solid-phase or liquid possessing electro-optical, photo-refractive or non-linear properties.

15. A method for producing a hologram, said method comprising the steps of:
providing a porous transparent siliceous body;
filling microcavities of said siliceous body with a polymerisable composition;
writing a hologram within said siliceous body using a light that converts portions of said polymerisable composition into a polymerized material, leaving other portions of said polymerisable material as non-polymerized material; and
removing said non-polymerized material from said siliceous body to produce said hologram.

16. The method of claim 15, further comprising the step of filling said microcavities that had non-polymerized material removed therefrom with a transparent solid-phase or liquid possessing electro-optical, photo-refractive or non-linear properties so as to be able to controllably alter the properties of the hologram.

17. The method of claim 15, wherein said non-polymerized material is removed by treating said siliceous body with an organic solvent.

18. The method of claim 15, wherein said non-polymerized material is removed by treating said siliceous body with an organic solvent in an ultra-sonic field.

19. The method of claim 15, wherein said non-polymerized material is removed by evaporating said non-polymerized material from said siliceous body.

20. The method of claim 15, wherein said polymerized material within said microcavities has a volume fraction that is close to 1 in the vicinity of a maximum of a recorded interference pattern and close to 0 in the vicinity of a minimum of a recorded interference pattern.

21. The method of claim 15, wherein said siliceous body is a siliceous glass.

22. The method of claim 15, wherein said polymeric material is a polymer or copolymer having at least one acrylic monomer/oligomer.

23. The method of claim 15, wherein said polymeric material is a polymer or copolymer having at least one methacrylic monomer/oligomer.

24. The method of claim 15, wherein said polymeric material is a polymer or copolymer having at least one vinyl structure monomer/oligomer.

25. An optical device, comprising:
- a light source or a connector to an external light source; and
- a hologram including a porous transparent siliceous body having a plurality of microcavities which contain a spatially distributed solid-phase polymeric material which together with said siliceous body exhibits lacal variations of refractice indexes in conformity with an intensity of a recorded interference pattern wherein said polymeric material within said microcavities has a volume fraction that is close to 1 in the vicinity of a maxima of the recorded interference pattern and close to 0 in the vicinity of a minima of the recorded interference pattern.

26. The optical device of claim 25, wherein said siliceous body is a siliceous glass.

27. The optical device of claim 25, wherein said polymeric material is a polymer or copolymer.

* * * * *